United States Patent
Masui et al.

(10) Patent No.: US 8,514,905 B2
(45) Date of Patent: Aug. 20, 2013

(54) LASER DIODE

(75) Inventors: Yuji Masui, Kanagawa (JP); Rintaro Koda, Tokyo (JP); Tomoyuki Oki, Kanagawa (JP); Takahiro Arakida, Kanagawa (JP); Naoki Jogan, Kanagawa (JP); Yoshinori Yamauchi, Tokyo (JP)

(73) Assignee: Sony Corporation, Tokyo (JP)

(*) Notice: Subject to any disclaimer, the term of this patent is extended or adjusted under 35 U.S.C. 154(b) by 4 days.

(21) Appl. No.: 12/805,876

(22) Filed: Aug. 23, 2010

(65) Prior Publication Data

US 2011/0064109 A1      Mar. 17, 2011

(30) Foreign Application Priority Data

Sep. 11, 2009   (JP) .................................. 2009-210735

(51) Int. Cl.
*H01S 5/00*        (2006.01)
(52) U.S. Cl.
USPC ............... 372/46.013; 372/50.11; 372/50.124
(58) Field of Classification Search
USPC .................................................. 372/46.013
See application file for complete search history.

(56) References Cited

U.S. PATENT DOCUMENTS

| | | | | |
|---|---|---|---|---|
| 5,719,892 A | * | 2/1998 | Jiang et al. | 372/50.11 |
| 6,317,446 B1 | * | 11/2001 | Wipiejewski | 372/46.01 |
| 2001/0021214 A1 | * | 9/2001 | Jiang et al. | 372/50 |
| 2007/0121694 A1 | * | 5/2007 | Okamoto | 372/50.124 |

FOREIGN PATENT DOCUMENTS

| | | |
|---|---|---|
| JP | 2004-179640 | 6/2004 |
| JP | 2004-281969 | 10/2004 |
| JP | 2005-354038 | 12/2005 |

* cited by examiner

*Primary Examiner* — Jessica Stultz
*Assistant Examiner* — Xinning Niu
(74) *Attorney, Agent, or Firm* — Rader, Fishman & Grauer PLLC

(57) ABSTRACT

A laser diode with which separation of a current narrowing layer is able to be prevented is provided. The laser diode includes a mesa that has a first multilayer film reflector, an active layer, and a second multilayer film reflector in this order, and has a current narrowing layer for narrowing a current injected into the active layer and a buffer layer adjacent to the current narrowing layer. The current narrowing layer is formed by oxidizing a first oxidized layer containing Al. The buffer layer is formed by oxidizing a second oxidized layer whose material and a thickness are selected so that an oxidation rate is higher than that of the first multilayer film reflector and the second multilayer film reflector and is lower than that of the first oxidized layer. A thickness of the buffer layer is 10 nm or more.

17 Claims, 5 Drawing Sheets

LASER DIODE

BACKGROUND OF THE INVENTION

1. Field of the Invention

The present invention relates to a laser diode emitting laser light in the lamination direction.

2. Description of the Related Art

A Vertical Cavity Surface Emitting Laser (VCSEL) consumes lower power than that of an edge emitting laser diode, and is able to be directly modulated. Thus, in recent years, the VCSEL has been used as an inexpensive optical communication light source.

The VCSEL is generally provided with a columnar mesa in which a lower DBR layer, a lower spacer layer, an active layer, an upper spacer layer, an upper DBR layer, and a contact layer are layered in this order on a substrate. In one of the lower DBR layer and the upper DBR layer, to improve efficiency of current injection into the active layer and lower the threshold current, a current narrowing layer having a structure that a current injection region is narrowed is provided. Electrodes are respectively provided on the top face of the mesa and the rear face of the substrate. In the laser diode, a current injected from the electrode is narrowed by the current narrowing layer, and then injected into the active layer where light is emitted due to electron-hole recombination. The light is reflected by the lower DBR layer and the upper DBR layer, laser oscillation is generated in a given wavelength, and the light is emitted as laser light from the top face of the mesa.

In the foregoing VCSEL, instability around the current narrowing layer may lower the reliability. For example, after the current narrowing layer is formed by performing oxidation process in the course of manufacture, alloying (thermal treatment) is performed to obtain ohmic contact between the electrode and the semiconductor. At this time, in some cases, the current narrowing layer is separated. Such separation of the current narrowing layer may result from strain generated by the oxidation treatment and an oxidized species (for example, oxygen and moisture) remaining in the current narrowing layer.

To address the foregoing disadvantage, in the past, various resolution methods have been proposed. For example, in Japanese Unexamined Patent Application Publication No. 2004-179640, the following method is described. In the method, a Group semiconductor layer containing In is provided adjacent to the top and the bottom of a current narrowing layer. Thereby, entire strain is compensated.

SUMMARY OF THE INVENTION

However, the method described in Japanese Unexamined Patent Application Publication No. 2004-179640 does not prevent an event in which the oxidized species remaining in the current narrowing layer is reacted with unintentional section to cause deterioration of laser quality. Further, it is originally difficult to add a small amount of In, P or the like precisely to a laminated structure formed from only AlGaAs.

In view of such a disadvantage, in the invention, it is desirable to provide a laser diode with which separation of a current narrowing layer is able to be prevented.

According to an embodiment of the invention, there is provided a laser diode including a mesa that has a first multilayer film reflector, an active layer, and a second multilayer film reflector in this order. The mesa further has a current narrowing layer for narrowing a current injected into the active layer and a buffer layer adjacent to the current narrowing layer. The current narrowing layer is formed by oxidizing a first oxidized layer containing Al. The buffer layer is formed by oxidizing a second oxidized layer whose material and a thickness are selected so that an oxidation rate is higher than that of the first multilayer film reflector and the second multilayer film reflector and is lower than that of the oxidized layer. The thickness of the buffer layer is 10 nm or more.

In the laser diode of the embodiment of the invention, the buffer layer is formed adjacent to the current narrowing layer. Thereby, for example, in the course of manufacture, in the case where thermal treatment is performed for the device after the current narrowing layer is formed by performing oxidation treatment for the first oxidized layer, the oxidized species remaining in the current narrowing layer are diffused into the buffer layer, where stability is obtained. Thereby, there is no possibility that the oxidized species remaining in the current narrowing layer are reacted with unintentional section.

According to the laser diode of the embodiment of the invention, the oxidized species remaining in the current narrowing layer are not reacted with unintentional section. Thus, separation of the current narrowing layer is able to be prevented.

Other and further objects, features and advantages of the invention will appear more fully from the following description.

DETAILED DESCRIPTION OF THE PREFERRED EMBODIMENT

An embodiment of the invention will be hereinafter described in detail with reference to the drawings. The description will be given in the following order:

1. Embodiment

FIG. 1A to FIG. 6

Figure 1A:
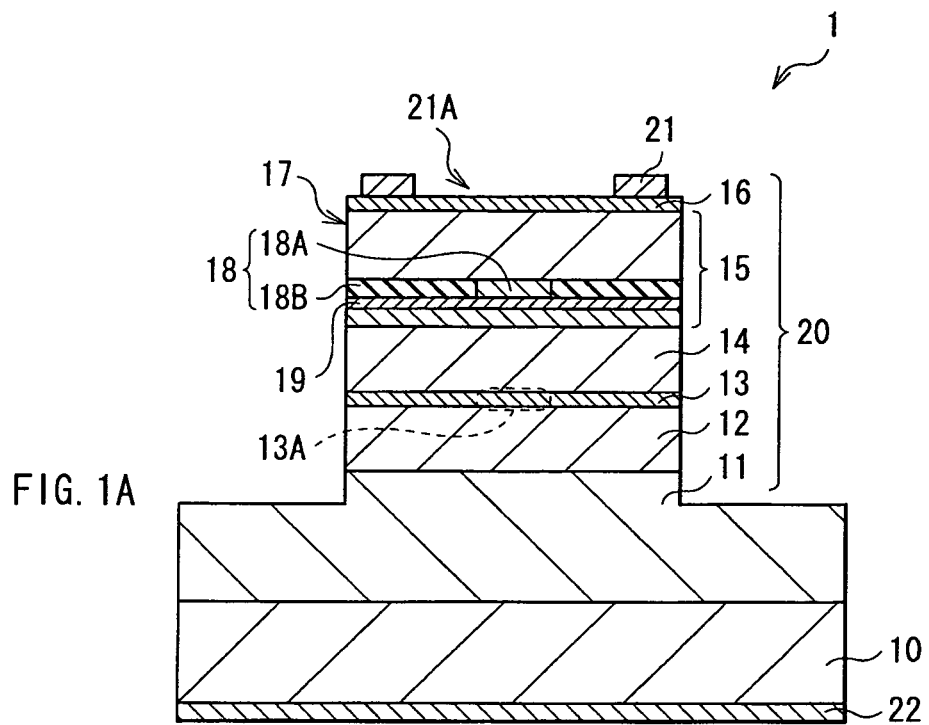
FIGS. 1A and 1B are cross sectional views of a Vertical Cavity Surface Emitting Laser (laser diode) according to an embodiment of the invention.
Figure 1B:
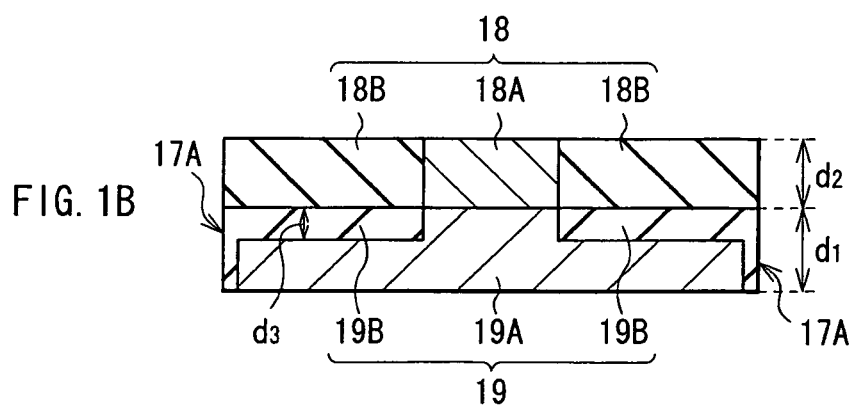
Figure 2:
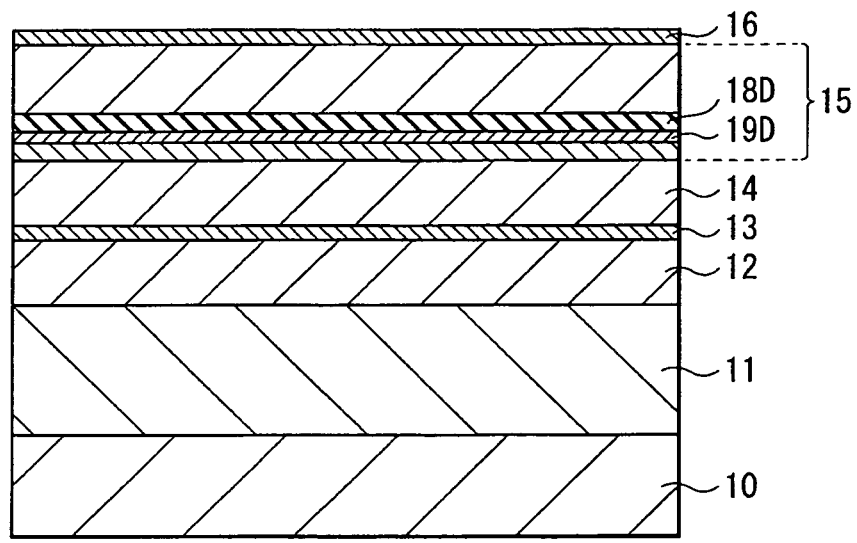
FIG. 2 is a cross sectional view for explaining an example of a step of manufacturing the laser diode of FIG. 1.

Example that a buffer layer is provided directly above a current narrowing layer Example that the buffer layer and the current narrowing layer are provided in an upper DBR layer 2. Modified Example Without Drawings Example that a buffer layer is provided directly below a current narrowing layer, or provided both above and below the current narrowing layer Example that the buffer layer and the current narrowing layer are provided in a region other than the upper DBR layer Embodiment FIG. 1A illustrates an example of a cross sectional structure of a Vertical Cavity Surface Emitting Laser 1 (laser diode 1) according to an embodiment of the invention. FIG. 1B is an enlarged main part of the laser diode 1 of FIG. 1A. FIG. 1A to FIG. 2 are schematic views, and thus the dimensions and the shapes thereof are different from the actual dimensions and the actual shapes.

The laser diode 1 includes a semiconductor layer 20 in which a lower DBR layer 11, a lower spacer layer 12, an active layer 13, an upper spacer layer 14, an upper DBR layer 15, and a contact layer 16 are included in this order on one face side of a substrate 10. The upper section of the semiconductor layer 20, specifically, part of the lower DBR layer 11, the lower spacer layer 12, the active layer 13, the upper spacer layer 14, the upper DBR layer 15, and the contact layer 16 is a columnar mesa 17.

In this embodiment, the lower DBR layer 11 corresponds to a specific example of "a first multilayer film reflector" of the invention. The upper DBR layer 15 corresponds to a specific example of "a second multilayer film reflector" of the invention.

The substrate 10 is, for example, an n-type GaAs substrate. Examples of n-type impurity include silicon (Si) and selenium (Se). Each of the layers included in the semiconductor layer 20 is, for example, composed of AlGaAs compound semiconductor. The AlGaAs compound semiconductor means a compound semiconductor containing at least aluminum (Al) and gallium (Ga) out of Group 3B elements in the short period periodic table and at least arsenic (As) out of Group 5B elements in the short period periodic table.

The lower DBR layer 11 is formed by alternately layering a low-refractive index layer (not illustrated) and a high-refractive index layer (not illustrated). The low-refractive index layer is composed of n-type $Al_{x1}Ga_{1-x1}As$ (0<x1<1) having a thickness of $\lambda_0/4n_1$ ($\lambda_0$ is an oscillation wavelength, and $n_1$ is a refractive index), for example. The high-refractive index layer is composed of n-type $Al_{x2}Ga_{1-x2}As$ (0<x2<1) having a thickness of $\lambda_0/4n_2$ ($n_2$ is a refractive index), for example.

The lower spacer layer 12 is composed of, for example, n-type $Al_{x3}Ga_{1-x3}As$ (0<x3<1). The active layer 13 is composed of, for example, undoped $Al_{x4}Ga_{1-x4}As$ (0<x4<1). In the active layer 13, a region opposed to an after-mentioned current injection region 18A becomes a light emitting region 13A. The spacer layer 14 is composed of, for example, p-type $Al_{x5}Ga_{1-x5}As$ (0≦x5<1). Examples of p-type impurity include zinc (Zn), magnesium (Mg), and beryllium (Be).

The upper DBR layer 15 is formed by alternately layering a low-refractive index layer (not illustrated) and a high-refractive index layer (not illustrated). The low-refractive index layer is composed of p-type $Al_6Ga_{1-x6}As$ (0<x6<1) having a thickness of $\lambda_0/4n_3$ ($n_3$ is a refractive index), for example. The high-refractive index layer is composed of p-type $Al_{x7}Ga_{1-x7}As$ (0<x7<x6) having a thickness of $\lambda_0/4n_4$ ($n_4$ is a refractive index), for example. The contact layer 16 is composed of, for example, p-type $Al_{x8}Ga_{1-x8}As$ (0<x8<1).

Further, the laser diode 1 is further provided with a current narrowing layer 18 and a buffer layer 19. The current narrowing layer 18 and the buffer layer 19 are provided in the upper DBR layer 15.

The current narrowing layer 18 is located on the side opposite to the active layer 13 with respect to the buffer layer 19. The current narrowing layer 18 is, for example, provided in a region of a low-refractive index layer that is apart by several layers from the active layer 13 side instead of the low-refractive index layer in the upper DBR layer 15. The current narrowing layer 18 has a current injection region 18A and a current narrowing region 18B. The current injection region 18A is formed in the central region in the plane. The current narrowing region 18B is formed on the periphery of the current injection region 18A, that is, in the outer edge region of the current narrowing layer 18, and is in the shape of a circle. In this embodiment, the current injection region 18A corresponds to a specific example of "first non-oxidized region" of the invention. The current narrowing region 18B corresponds to a specific example of "first oxidized region" of the invention.

The current injection region 18A is composed of, for example, p-type $Al_{x9}Ga_{1-x9}As$ (0.98≦x9≦1). The current narrowing region 18B contains, for example, aluminum oxide ($Al_2O_3$). As will be described later, for example, the current narrowing region 18B is obtained by oxidizing an oxidized layer 18D composed of p-type $Al_{x9}Ga_{1-x9}As$ from the side face of the mesa 17. Thereby, the current narrowing layer 18 has a function to narrow a current.

The buffer layer 19 is located closer to the active layer 13 than the current narrowing layer 18 is. The buffer layer 19 is formed adjacent to the current narrowing layer 18. The buffer layer 19 is, for example, as illustrated in FIG. 1B, formed being contacted with the face (bottom face) on the active layer 13 side of the current narrowing layer 18. For example, a thin layer having a thickness of about several mm may be provided between the current narrowing layer 18 and the buffer layer 19. The buffer layer 19 is provided in a region of a high-refractive index layer that is apart by several layers from the current narrowing layer 18 instead of the high-refractive index layer in the upper DBR layer 15.

The buffer layer 19 has an un-oxidized region 19A and an oxidized region 19B. The un-oxidized region 19A is mainly formed in the central region in the plane, and is, for example, formed in a region contacted with the current injection region 18A. The oxidized region 19B is formed on the periphery of the un-oxidized region 19A, and is in the shape of a circle. The oxidized region 19B is mainly formed in the outer edge region in the plane, and is, for example, formed in the region contacted with the current narrowing region 18B. The oxidized region 19B is formed disproportionately close to the current narrowing layer 18 side in the part other than the part corresponding to the outer edge region of the buffer layer 19. In this embodiment, the un-oxidized region 19A corresponds to a specific example of "second non-oxidized region" of the invention. The oxidized region 19B corresponds to a specific example of "second oxidized region" of the invention.

The un-oxidized region 19A is composed of a semiconductor material containing Al, and is, for example, composed of p-type $Al_{x10}Ga_{1-x10}As$ (0.85≦x10≦0.98) or p-type $InAl_{x11}GaAs$ (0.85<x11≦0.98). The oxidized region 19B contains, for example, aluminum oxide ($Al_2O_3$). As will be described later, for example, the oxidized region 19B is obtained by oxidizing an oxidized layer 19D composed of p-type $Al_{x10}Ga_{1-x10}As$ or p-type $InAl_{x11}GaAs$ from the side face side of the mesa 17 and the oxidized layer 18D side. The material and the thickness of the oxidized layer 19D are selected so that the oxidation rate thereof is higher than that of the lower DBR layer 11 and the upper DBR layer 15 and is lower than that of the oxidized layer 18D.

Thickness $d_1$ of the buffer layer 19 (oxidized layer 19D) is 10 nm or more, with which oxidized species remaining in the current narrowing layer 18 in the course of manufacture is able to be sufficiently taken in. The thickness $d_1$ of the buffer layer 19 is preferably equal to or larger than thickness $d_2$ of the current narrowing layer 18 (oxidized layer 18D). However, in the case where the thickness $d_1$ of the buffer layer 19 is excessively thick, it affects the DBR structure. Thus, the thickness $d_1$ of the buffer layer 19 is preferably 50 nm or less. Thickness $d_3$ of the section formed disproportionately close to the current narrowing layer 18 side of the oxidized region 19B is not particularly limited, but is at least smaller than the thickness $d_1$ of the buffer layer 19.

On the top face of the mesa 17 (top face of the contact layer 16), a circular upper electrode 21 having an aperture (light emitting aperture 21A) at least in a region opposed to the current injection region 18A is formed. On the side face and the surrounding surface of the mesa 17, an insulating layer (not illustrated) is formed. On the surface corresponding to the surrounding of the mesa 17 of the insulating layer, an electrode pad (not illustrated) for bonding a wire (not illustrated) and a connection section (not illustrated) are provided. The electrode pad is electrically connected to the upper electrode 21 through the connection section. Further, on the rear face of the substrate 10, a lower electrode 22 is provided.

The upper electrode 21, the electrode pad, and the connection section are, for example, structured by layering, titanium (Ti), platinum (Pt), and gold (Au) in this order, and are electrically connected to the contact layer 16 located in the upper part of the mesa 17. The lower electrode 22 has a structure in which, for example, an alloy of gold (Au) and germanium (Ge), nickel (Ni), and gold (Au) are layered sequentially from the substrate 10 side. The lower electrode 22 is electrically connected to the substrate 10.

Manufacturing Method

Figure 3:
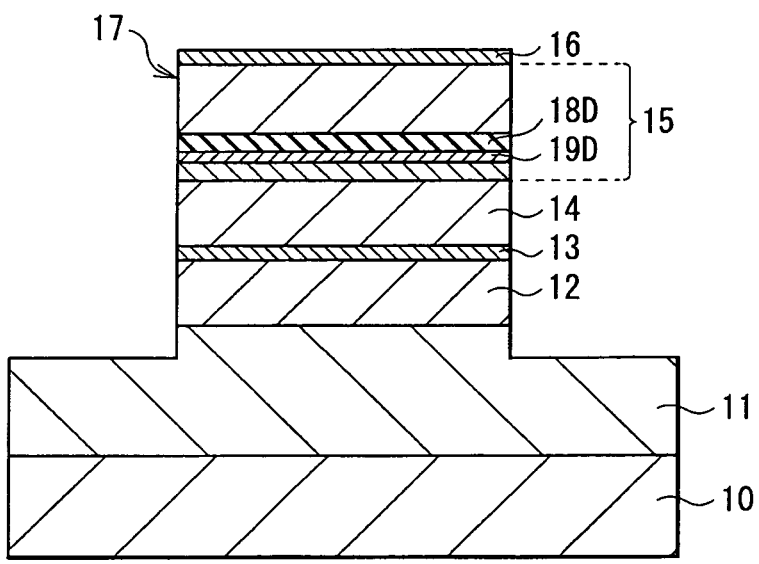
FIG. 3 is a cross sectional view for explaining a step following FIG. 2.

Next, a description will be given of an example of a method of manufacturing the laser diode 1 of this embodiment. FIGS. 2 and 3 illustrate the manufacturing method in order of steps.

For example, the compound semiconductor layer on the substrate 10 composed of GaAs is formed by MOCVD (Metal Organic Chemical Vapor Deposition) method. At this time, as a raw material of Group III-V compound semiconductor, for example, trimethyl aluminum (TMA), trimethyl gallium (TMG), trimethyl indium (TMIn), and arsine ($AsH_3$) are used. As a raw material of donor impurity, for example, $H_2Se$ is used. As a raw material of acceptor impurity, for example, dimethyl zinc (DMZ) is used.

Specifically, first, the lower DBR layer 11, the lower spacer layer 12, the active layer 13, the upper spacer layer 14, the upper DBR layer 15, and the contact layer 16 are layered in this order over the substrate 10 (FIG. 2). At this time, in the upper DBR layer 15, the oxidized layer 18D and the oxidized layer 19D are formed so that the oxidized layer 19D is closer to the active layer than the oxidized layer 18D is.

The oxidized layer 18D is a layer to become the current narrowing layer 18 by being oxidized in the after-mentioned oxidization step. For example, the oxidized layer 18D is composed of AlAs. The oxidized layer 19D is a layer to become the buffer layer 19 by being oxidized in the after-mentioned oxidation step. For example, the oxidized layer 19D is composed of $Al_{0.90}GaAs$. As described above, the material and the thickness of the oxidized layer 19D are selected so that the oxidation rate thereof is higher than that of the lower DBR layer 11 and the upper DBR layer 15 and is lower than that of the oxidized layer 18D.

Next, a circular resist layer (not illustrated) having a diameter equal to the diameter of the mesa 17 is formed on the surface of the contact layer 16. Next, with the use of the foregoing resist layer as a mask, part of the lower DBR layer 11, the lower spacer layer 12, the active layer 13, the upper spacer layer 14, the upper DBR layer 15, the contact layer 16, the oxidized layer 18D, and the oxidized layer 19D are selectively removed by, for example, RIE (Reactive Ion Etching) method to form the mesa 17 directly below the circular resist layer (not illustrated) (FIG. 3). At this time, the oxidized layer 18D and the oxidized layer 19D are exposed on the side face of the mesa 17. After that, the foregoing resist layer is removed.

Next, oxidation treatment is performed at high temperature in the water vapor atmosphere to concurrently oxidize Al contained in the oxidized layer 18D and the oxidized layer 19D from the side face of the mesa 17. At this time, since the oxidized layer 18D is easily oxidized than the oxidized layer 19D, the oxidized layer 19D is also oxidized from the oxidized layer 18D side. Thereby, in the mesa 17, the outer edge region of the oxidized layer 18D becomes an insulating layer (aluminum oxide), and the current narrowing layer 18 is formed (refer to FIG. 1B). Further, in the mesa 17, the outer edge region of the oxidized layer 19D and a vicinity of the oxidized layer 19D except for the central section of the oxidized layer 19D becomes an insulating layer (aluminum oxide), and the buffer layer 19 is formed (refer to FIG. 1B).

Next, over the entire surface, an insulating layer (not illustrated) made of an insulating inorganic material such as silicon oxide ($SiO_2$) is formed. Subsequently, the resist layer (not illustrated) having a circular aperture on the top face of the mesa 17 is formed on the entire surface. After that, with the use of the resist layer as a mask, the insulating layer is selectively removed by, for example, ME method. Thereby, an aperture (not illustrated) is formed in a part where the upper electrode 21 is to be formed. After that, the resist layer is removed.

Next, for example, by vacuum evaporation method, the foregoing metal material is layered on the entire surface. After that, for example, by selective etching, the circular upper electrode 21 is formed to fill in the aperture of the insulating layer, and an electrode pad (not illustrated) is formed on the surface corresponding to the surrounding of the mesa 17 in the insulating layer. Further, a connection section (not illustrated) is formed therebetween. Further, the rear face of the substrate 10 is polished as appropriate to adjust the thickness thereof. After that, the lower electrode 22 is formed on the rear face of the substrate 10 (FIG. 1A). After that, for example, alloying (thermal treatment) is performed at temperature from 300 deg C. to 350 deg C. both inclusive to obtain ohmic contact between the upper electrode 21 and the contact layer 16. Accordingly, the laser diode 1 of this embodiment is manufactured.

Action and Effect

Figure 4:
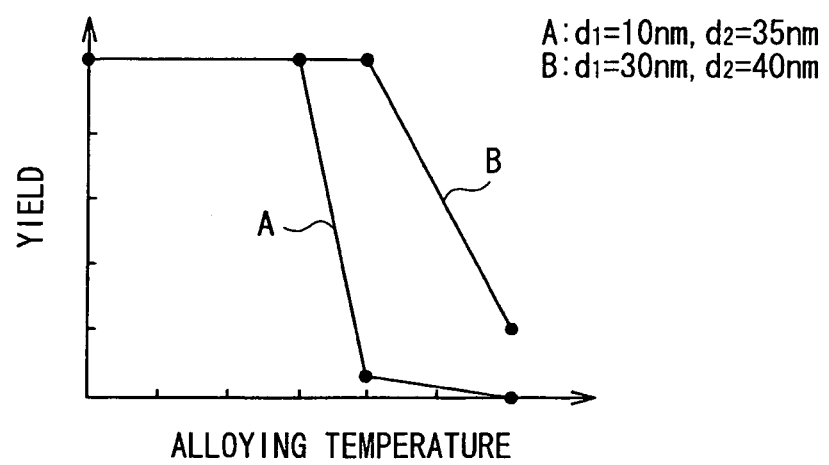
FIG. 4 is a relation diagram illustrating a relation between alloying temperature in the course of manufacturing the laser diode of FIG. 1 and yield.
Figure 5A:
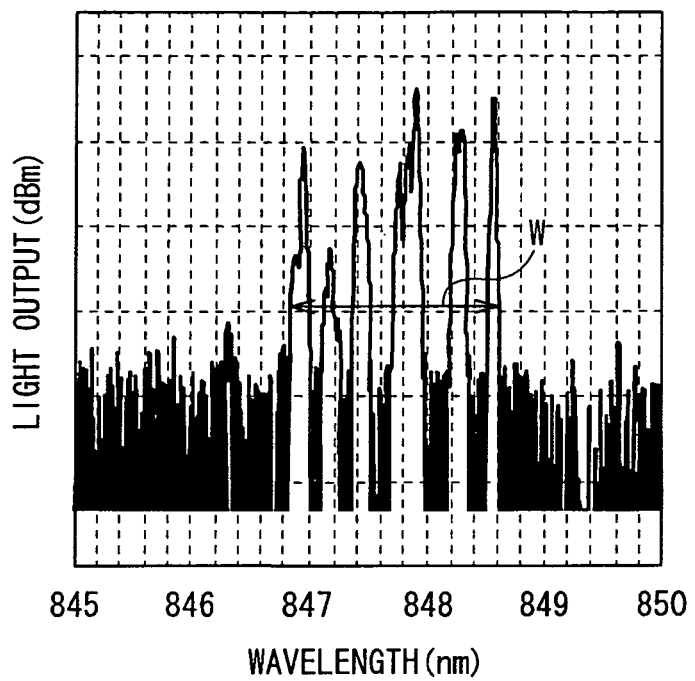
FIGS. 5A and 5B are spectrum diagrams illustrating an example of spectrum distributions of the laser diode of FIG. 1.
Figure 5B:
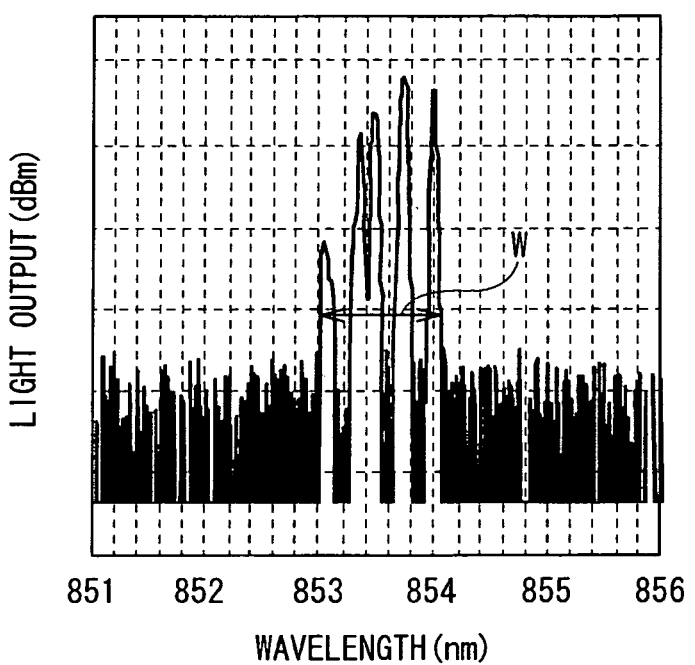
Figure 6:
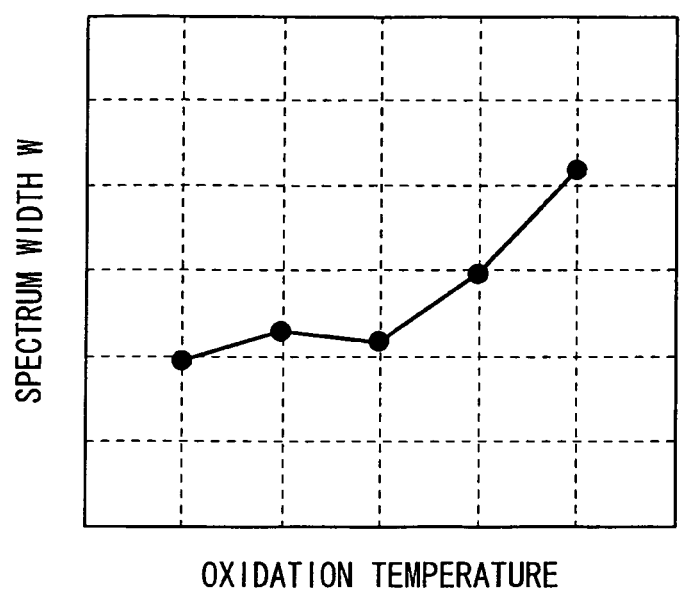
FIG. 6 illustrates a relation diagram between oxidation temperature in the course of manufacturing the laser diode of FIG. 1 and RMS width.

Next, a description will be given of action and effect of the laser diode 1 of this embodiment with reference to FIG. 4 to FIG. 6. FIG. 4 illustrates a relation between alloying temperature in the course of manufacturing the laser diode 1 and yield. FIGS. 5A and 5B are spectrum diagrams illustrating an example of spectrum distributions of the laser diode 1. FIG. 5A illustrates a result in the case where the thickness $d_3$ is large, and FIG. 5B illustrates a result in the case where the thickness $d_3$ is small. FIG. 6 illustrates a relation between oxidation temperature in the course of manufacturing the laser diode 1 and spectrum width W.

In the laser diode 1 of this embodiment, in the case where a given voltage is applied between the lower electrode 22 and the upper electrode 21, a current is injected through the current injection region 18A in the current narrowing layer 18 and the oxidized region 19A in the buffer layer 19 into the active layer 13. Thereby, light is emitted by electron-hole recombination. The light is reflected by the pair of lower DBR layer 11 and the upper DBR layer 15, laser oscillation is generated in a given wavelength $\lambda_0$, and beam light is emitted outside from the light emitting aperture 21A.

In this embodiment, the buffer layer 19 is formed adjacent to the current narrowing layer 18. The thickness $d_1$ of the buffer layer 19 is 10 µm or more with which oxidized species remaining in the current narrowing layer 18 in the course of manufacture is able to be sufficiently taken in. Thereby, for example, in the course of manufacture, in the case where alloying (thermal treatment) is performed for the device after the current narrowing layer 18 is formed by performing oxidation treatment for the oxidized layer 18D, the oxidized species remaining in the current narrowing layer 18 are diffused into the buffer layer 19, where stability is obtained. Thereby, there is no possibility that the oxidized species remaining in the current narrowing layer 18 are reacted with unintentional section. Thus, separation of the current narrowing layer 18 is able to be prevented.

For example, as illustrated in FIG. 4, by providing the buffer layer 19 having the thickness $d_1$ of 10 nm or more in a position adjacent to the current narrowing layer 18, yield at temperature generally used in alloying (thermal treatment) is able to be increased.

Further, in this embodiment, the buffer layer 19 is formed adjacent to the current narrowing layer 18. Thus, optical field in the laser diode 1 senses the current narrowing region 18B and the oxidized region 19B. Thus, by changing the thickness $d_3$ of the oxidized region 19B, influence on the optical field in the laser diode 1 is able to be controlled. For example, spectrum width W of beam light emitted from the light emitting aperture 21A is able to be controlled.

For example, as illustrated in FIG. 5A, by increasing the thickness $d_3$ of the oxidized region 19B, the spectrum width W is able to be increased. By contraries, for example, as illustrated in FIG. 5B, by decreasing the thickness $d_3$ of the oxidized region 19B, the spectrum width W is able to be decreased. Further, for example, as illustrated in FIG. 6, in the case where the thickness $d_3$ of the oxidized region 19B is decreased and increased by lowering and raising oxidation temperature in the course of manufacture, the spectrum width W is able to be decreased or increased.

Modified Example

Descriptions have been hereinbefore given of the invention with reference to the embodiment. However, the invention is not limited to the foregoing embodiment, and various modifications may be made.

For example, in the foregoing embodiment, the current narrowing layer 18 and the buffer layer 19 are formed in the upper DBR layer 15. However, the current narrowing layer 18 and the buffer layer 19 may be formed in other place. For example, the current narrowing layer 18 and the buffer layer 19 may be formed in the upper spacer layer 14, or may be formed between the upper spacer layer 14 and the upper DBR layer 15. Further, for example, the current narrowing layer 18 and the buffer layer 19 may be formed in the lower DBR layer 11, may be formed in the lower spacer layer 12, or may be formed between the lower spacer layer 12 and the lower DBR layer 11.

Further, in the foregoing embodiment, the buffer layer 19 is provided closer to the active layer 13 than the current narrowing layer 18 is. By contraries, the buffer layer 19 may be provided apart from the active layer 13. Further, in the foregoing embodiment, only one buffer layer 19 is provided. However, according to needs, the buffer layer 19 may be provided both above and below the current narrowing layer 18.

Further, in the foregoing embodiment, the description has been given of the AlGaAs compound laser diode as an example. However, the invention is applicable to other compound laser diode such as a laser diode composed of oxidizable compound semiconductor.

The present application contains subject matter related to that disclosed in Japanese Priority Patent Application JP 2009-210735 filed in the Japan Patent Office on Sep. 11, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A laser diode comprising:
   a current narrowing region of a current narrowing layer between a current injection region of the current narrowing layer and a side face of the current narrowing layer, said current narrowing region being oxidized and said current injection region being non-oxidized;
   an oxidized buffer region of a buffer layer between an un-oxidized buffer region of the buffer layer and a side face of the buffer layer, a section of the oxidized buffer region being between said current narrowing region and a portion of the un-oxidized buffer region;
   an active layer between a lower spacer layer and an upper spacer layer, said buffer layer being between said active layer and said current narrowing layer,
   wherein an oxidation rate of the buffer layer is lower than an oxidation rate of the current narrowing layer.

2. The laser diode according to claim 1, wherein the thickness of said buffer layer is equal to or larger than the thickness of said current narrowing layer, the thickness of said section of the oxidized buffer region being smaller than said thickness of said buffer layer.

3. The laser diode according to claim 1, wherein said current narrowing layer is in physical contact with said buffer layer.

4. The laser diode according to claim 1, wherein said un-oxidized buffer region is in physical contact with said current injection region.

5. The laser diode according to claim 1, wherein said oxidized buffer region is in physical contact with said narrowing region.

6. The laser diode according to claim 1, wherein a light emitting region of the active layer is configured to emit light, said un-oxidized buffer region being between said current injection region and said light emitting region.

7. The laser diode according to claim 1, wherein said section of the oxidized buffer region is in physical contact with said un-oxidized buffer region and said current narrowing region.

8. The laser diode according to claim 1, wherein said current injection region contains aluminum, gallium, and arsenic.

9. The laser diode according to claim 1, wherein said current narrowing region contains an aluminum oxide.

10. The laser diode according to claim 1, wherein said active layer is an undoped layer containing aluminum, gallium, and arsenic.

11. The laser diode according to claim 1, wherein said upper spacer layer is a p-type layer containing aluminum, gallium, and arsenic.

12. The laser diode according to claim 1, wherein said lower layer is an n-type layer containing aluminum, gallium, and arsenic.

13. The laser diode according to claim 1, wherein said oxidized buffer region contains an aluminum oxide.

14. The laser diode according to claim 1, wherein said buffer layer contains indium.

15. The laser diode according to claim 14, wherein said buffer layer contains aluminum, gallium, and arsenic.

16. The laser diode according to claim 1, wherein the thickness of said buffer layer is 50 nm or less.

17. The laser diode according to claim 16, wherein the thickness of said buffer layer is 10 nm or more.

* * * * *